United States Patent
Magnavacca et al.

(10) Patent No.: US 7,596,023 B2
(45) Date of Patent: Sep. 29, 2009

(54) MEMORY DEVICE EMPLOYING THREE-LEVEL CELLS AND RELATED METHODS OF MANAGING

(76) Inventors: Alessandro Magnavacca, Via Leopardi, 241/D, 20099 Sesto San Giovanni (IT); Massimiliano Scotti, Via Verga Giovanni, 10, 20063 Cernusco sul Naviglio (IT); Nicola Del Gatto, Via Asiago, 101, 20128 Milano (IT); Claudio Nava, Via Enrico Riva, 17, 20040 Cornate d'Adda (IT); Marco Ferrario, Via Giuba, 13, 20132 Milano (IT); Massimiliano Mollichelli, Via Pastore, 88, 20043 Arcore (IT)

( * ) Notice: Subject to any disclaimer, the term of this patent is extended or adjusted under 35 U.S.C. 154(b) by 52 days.

(21) Appl. No.: 11/934,144

(22) Filed: Nov. 2, 2007

(65) Prior Publication Data
US 2008/0106937 A1 May 8, 2008

(30) Foreign Application Priority Data
Nov. 3, 2006 (IT) .................. VA2006A00065
Apr. 27, 2007 (IT) .................. VA2007A00042

(51) Int. Cl.
*G11C 16/04* (2006.01)
(52) U.S. Cl. .............. 365/185.03; 365/168; 365/230.06
(58) Field of Classification Search ............ 365/185.03, 365/168, 230.06
See application file for complete search history.

(56) References Cited

U.S. PATENT DOCUMENTS
7,366,001 B2 * 4/2008 Hanzawa et al. ........... 365/49.1

* cited by examiner

*Primary Examiner*—Huan Hoang
(74) *Attorney, Agent, or Firm*—Schwabe, Williamson & Wyatt, P.C.

(57) ABSTRACT

A memory device may include an array of addressable three-level cells, a coding circuit being input with three-bit strings and generating corresponding ternary strings based upon a code, and a program circuit being input with the ternary strings and storing them in respective pairs of three-level cells. The memory device also may include a read circuit reading stored ternary strings in the respective pairs of three-level cells, and a decoding circuit being input with the stored ternary strings and generating corresponding strings of three bits based upon the code.

20 Claims, 16 Drawing Sheets

(*) repeated N times, if a page of N words is read

| Sense amp. output | | |
|---|---|---|
| Level read | msb | lsb |
| A | 1 | 1 |
| B | 1 | 0 |
| C | 0 | 0 |

| msbH lsbH | msbL lsbL | out2 | out1 | out0 |
|---|---|---|---|---|
| 1 1 | 1 1 | 1 | 1 | 1 |
| 1 1 | 1 0 | 1 | 1 | 0 |
| 1 1 | 0 0 | 0 | 1 | 0 |
| 1 0 | 1 1 | 0 | 1 | 1 |
| 1 0 | 1 0 | 1 | 0 | 1 |
| 1 0 | 0 0 | 0 | 0 | 1 |
| 0 0 | 1 1 | 0 | 1 | 0 |
| 0 0 | 1 0 | 1 | 0 | 0 |
| 0 0 | 0 0 | 0 | 0 | 0 |

MEMORY DEVICE EMPLOYING THREE-LEVEL CELLS AND RELATED METHODS OF MANAGING

FIELD OF THE INVENTION

The invention relates to semiconductor memory devices, and, more particularly, to a memory employing three-level cells and a related method.

BACKGROUND OF THE INVENTION

Standard FLASH memory devices comprise an array of one-bit storage cells, wherein each memory cell may assume two possible states that correspond to the two logic states ('1' or '0') of a bit. The two logic states are associated to different electric charges stored in a floating gate of the cell, that is, to different threshold voltages of the cell.

Typically, a programmed cell (logic value '0') has a higher threshold voltage than an erased cell (logic value '1'). Because of the statistical spread due to multiple causes, actual threshold voltages of erased cells and programmed cells of a memory sector typically have a statistical distribution generally as the one depicted in FIG. 1.

Multi-level memory devices are based on cells capable of assuming more than two logic states, and thus may store information for more than one bit. In a four-level memory, each cell is capable of storing two bits of information by fixing its threshold voltage according to the statistical distribution depicted in FIG. 2.

The state '11' is stored by performing an erase operation, the other three states ('10', '01' and '00') are obtained by performing a program operation. The more accurate the erase and program operations, the less dispersed the distributions of states '11', '10', '01' and '00' around the respective mean values.

An advantage of a two-bit-per-cell memory device may be the reduction of silicon area used compared to a one-bit-per-cell memory device of identical storage capacity. However, the program and read operations are more complex since the two-bit-per-cell memory device manages a larger number of threshold voltage levels for each cell. The precision with which read operations are carried out determines the amplitude of the applied separation interval $\Delta_{READ}$ between two adjacent threshold distributions, such that, the read operation may be reliably carried out. FIG. 3 depicts such a separation interval and the amplitudes $\Delta_{ERASE}$ and $\Delta_{PROGRAM}$ of the distributions of the threshold voltages.

There are two phenomena that may determine a minimum internal amplitude of the interval in which the threshold voltage of memory cells is defined: the "read disturb" for the lower bound, and the "retention" for the upper bound. The "read disturb" phenomenon, due to repeated read operations that are carried out on the device, raises (FIG. 4) the threshold voltage of low threshold voltage cells bringing them to change from this proper state of erased cells ('11') to behave as programmed cells ('10'). The "retention" phenomenon causes the loss of charge in the cells of high threshold ('00'), thus cells programmed to the state '00' tend to become cells programmed to the state '01', as also depicted in FIG. 4.

For a certain precision of read, program, and erase operations of the memory device, there may be an upper limit to the number different threshold distributions that may be implemented without "read disturb" and "retention" causing loss of information. Both phenomena are enhanced with the reduction of the size of the cells, thus there is a technological limit beyond which it becomes impossible to realize a two-bit-per-cell memory device of acceptable reliability.

In an attempt to address these limitations, an error correction code (ECC) is used by reserving memory cells, commonly called correction cells, the content of which is determined as a function of the data stored in the cells of the array to be able to correct eventual loss of information. For example, in NOR FLASH memory devices in which a page of data, typically comprising 4, 8, or 16 words, is read at one time, for each page, there is a certain number k of correction cells: the larger the value of k, the larger the number of bits that can be corrected on a same page.

A drawback of this approach is the addition of memory cells for ECC increases the silicon area occupied with respect to a standard multi-level memory of the same size (even if silicon area occupation remains smaller than a one-bit-per-cell memory device). Another drawback may be that the ECC limits the operations that may be executed by users. In a NOR FLASH memory device, it is possible to carry out the program operation on a single cell, but the erase operation may be executed in parallel on all the cells of a sector. The presence of cells for storing the ECC bit may not allow users to carry out a program operation on each page without erasing the whole memory sector. Indeed, a program operation (1→0) may imply erasing (0→1) for at least a correction cell. As stated hereinbefore, this may not be done on a single cell of a NOR FLASH memory device, but only on the whole addressed sector to which the cell belongs. As a consequence, the use of ECCs in NOR FLASH memory devices may limit the so-called "bit manipulation", i.e. the possibility of programming single bits of the memory.

SUMMARY OF THE INVENTION

A multi-level memory device and a related method of management that allow programming each single bit of the memory are provided. The memory device occupies a silicon area that is only slightly larger than a four-level memory devices of the same size and of same cell fabrication technology.

This result has been reached with a memory device and a related method of management that employs three-level cells in which each pair of cells stores a string of three bits. The memory device may further comprise a coding circuit, and a decoding circuit for converting in a write operation the strings of three bits to be stored in strings of two ternary values to be written in respective pairs of three-level cells and vice versa during a read operation. The possible states of each cell are at most three, thus the relative distributions of the three different read thresholds may be relatively farther from the voltage levels at which the "read disturb" and "retention" phenomena become more severe.

This management method may provide an approach to problems caused by eventual supply voltage drops or interruptions that may take place during a program phase and that may make the memory device compatible (interchangeable) with two-bit-per-cell memory device of identical storage capacity. Another method is provided and manages a memory with cells of k levels, k being different from a power of two. A related memory device is provided with k-level cells, in which strings of N bits are stored and encoded into corresponding k-level strings comprising C symbols, and these k-level strings are stored into corresponding groups of c memory cells.

The method may be applied to the case in which where the memory cells may assume more than three levels, though "bit manipulation" may not be guaranteed. For example, in case of memory devices employing six-level cells, it is possible to group the bits of each word in quintuplets and storing each quintuplet in a respective pair of six-level cells.

DETAILED DESCRIPTION OF THE PREFERRED EMBODIMENTS

In the multi-level memory device, each cell may assume one of three possible logic values, with the advantage of maintaining an area occupation smaller than that of a one-bit-per-cell memory device and with a smaller number of distributions than a two-bit-per-cell memory device. As a consequence, it is not indispensable to use error correction codes for ensuring reliability and this leaves "bit manipulation" practical.

Figure 1:
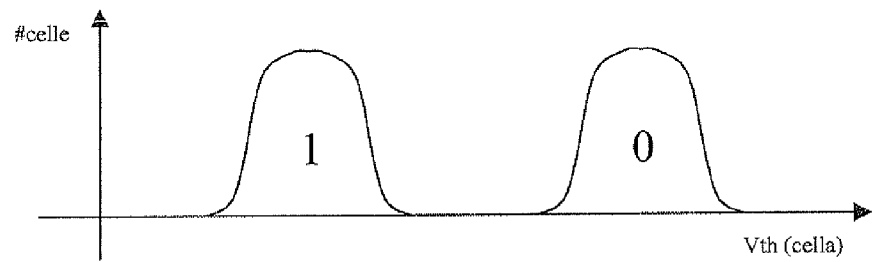
FIG. 1 depicts a distribution of thresholds of a memory cell for storing one bit, according to the prior art.
Figure 2:
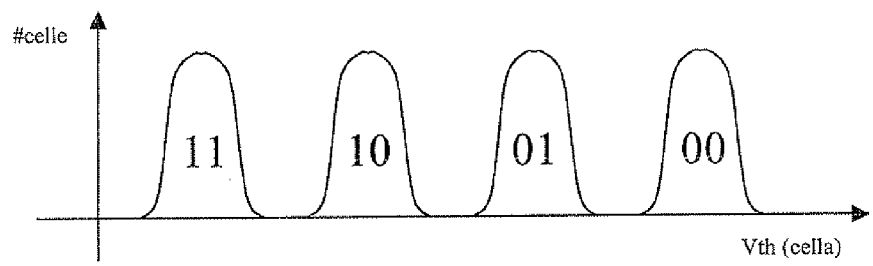
FIG. 2 depicts a distribution of thresholds of memory cells for storing two bits, according to the prior art.
Figure 3:
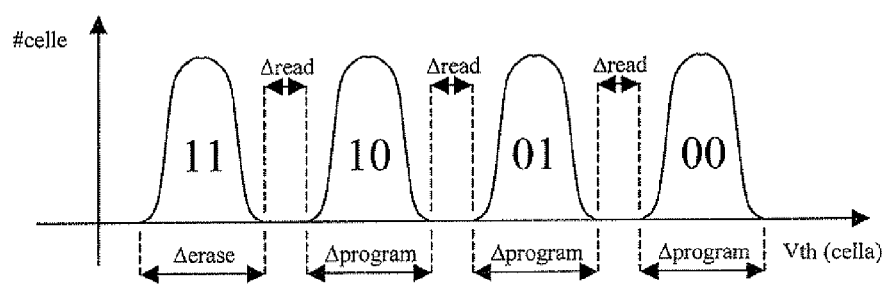
FIG. 3 illustrates parameters that define the distributions of threshold voltages of four-level memory cells, according to the prior art.
Figure 4:
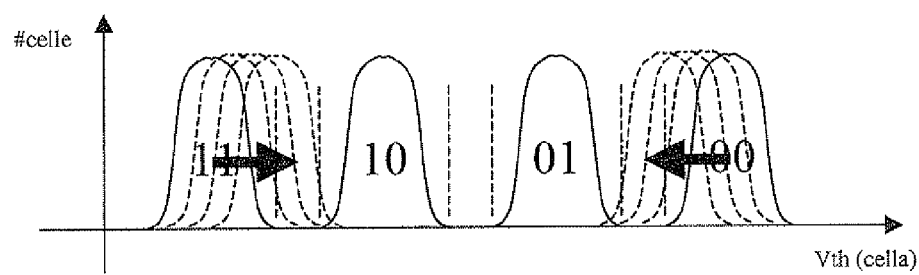
FIG. 4 illustrates how the distributions depicted in FIG. 3 may be altered because of the "read disturb" and "retention", according to the prior art.
Figure 5:
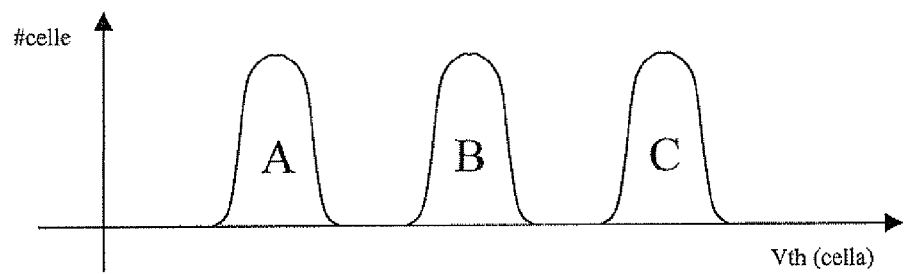
FIG. 5 depicts a sample distribution of thresholds of three-level cells of a memory device, according to the present invention.

To store bit strings in three-level memory cells in an efficient manner, it may be helpful to define a coding operation of binary strings in ternary strings that may be stored in three-level memory cells, and vice versa. The three levels 'A', 'B', and 'C' depicted in FIG. 5, that each cell may assume ('A' is the erased level, 'B' and 'C' the two programmed levels), are associated to each pair of cells (($3 \times 3 = 9$ possible states) 3 bits ($2^3 = 8$ possible combinations)).

Encoding nine possible pairs of levels in eight possible combinations of triplets of bits may permit "bit manipulation" even in the case of NOR FLASH memory devices. In other words, it should be possible to program each of the three bits of each string stored in a pair of three-level cells. In a three-level memory device, this is possible only if any programming of 1, 2 or 3 bits of the triplets corresponds always to programming of three-level cells, never implying erasing.

Figure 6:
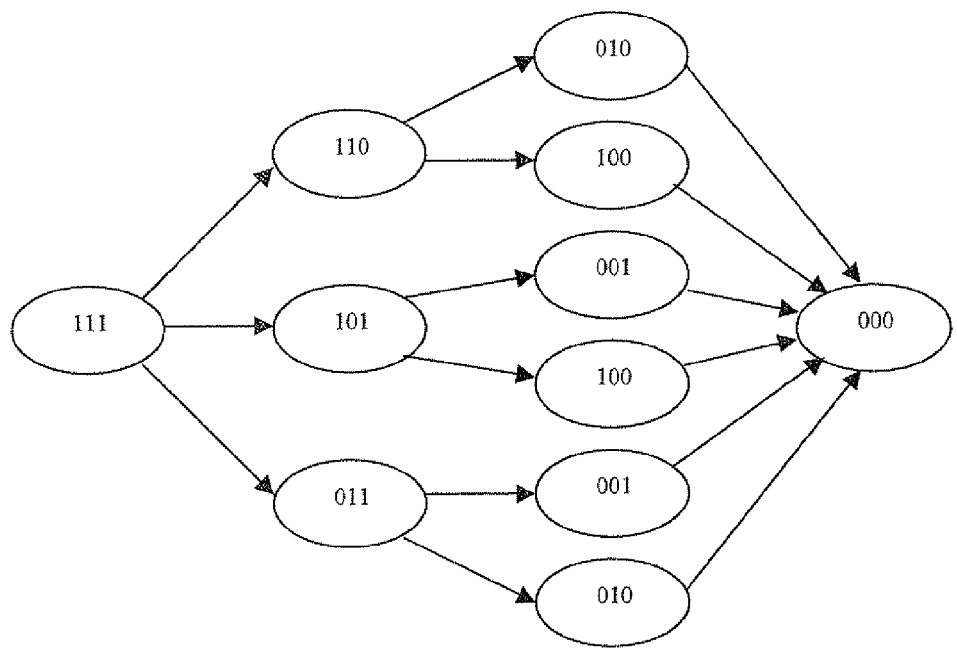
FIG. 6 illustrates possible transitions of a three-bit string from the state 111 to the state 000, according to the present invention.

First, possible transitions that may be carried out on a string of three bits by successive programming are identified: it is possible to program separately the three bits according to any order as depicted in FIG. 6. There are fifteen possible transitions (3+6+6) if one bit at the time is programmed, but it is possible to carry out simultaneously two or three transitions in case two or three bits are programmed together.

Figure 7:
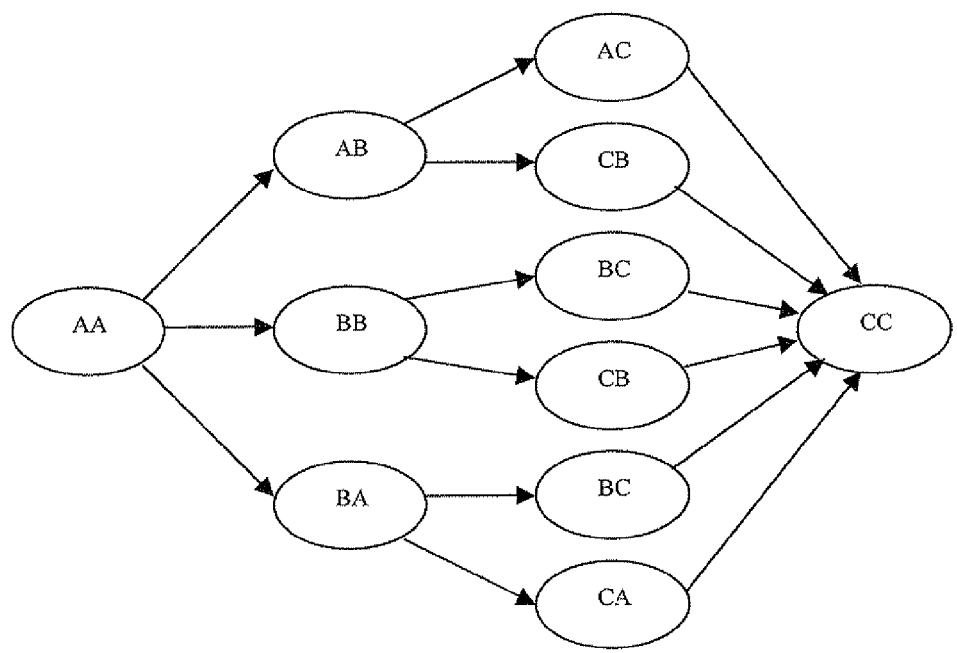
FIG. 7 depicts possible transitions of a string of two ternary symbols, according to the present invention.

A diagram similar to that of FIG. 7, comprising pairs of levels, is defined taking into account that each transition may contemplate only program operations of cells, that is transitions in the direction A→B→C:

the leftmost triplet ('111') corresponding to three erased bits is associated to the pair of erased cells ('AA');

similarly, the rightmost triplet ('000'), corresponding to the three programmed bits, is associated to the pair of cells programmed at the highest level ('CC'); and the three triplets corresponding to the first stage of transitions ('110', '101' and '011') should not contain cells at level 'C', because it may be possible to program each of these pairs in the state 'CC' passing through two intermediate states: the possible choices are listed in FIGS. 8-12 and comprise coding the three triplet of the first stage of transitions in pairs at most at B levels, that is 'AB', 'BB' and 'BA'.

The preferred embodiment is illustrated in FIG. 7. According to the scheme of FIG. 7, the pairs of levels belonging to the second stage of transitions, '001' and '100' may be associated to the states 'BC' and 'CB' (or vice versa), respectively, because they may be programmable starting from 'BB' and the remaining triplets ('010') may be associated to two pairs of different levels, one programmable from 'AB' ('AC') and the other programmable from 'BA' ('CA'). According to the schemes of FIGS. 11-12, one of the two strings '001' and '100' could be associated to 'AC' and to 'CA'.

By comparing the diagram depicted in FIG. 7 with that of FIG. 6, each string of three bits is associated to a respective pair of ternary symbols according to the coding illustrated in Table 1.

TABLE 1

| Level1 | Level0 | Bit2 | Bit1 | Bit0 |
|--------|--------|------|------|------|
| A | A | 1 | 1 | 1 |
| A | B | 1 | 1 | 0 |
| A | C | 0 | 1 | 0 |
| B | A | 0 | 1 | 1 |
| B | B | 1 | 0 | 1 |
| B | C | 0 | 0 | 1 |
| C | A | 0 | 1 | 0 |
| C | B | 1 | 0 | 0 |
| C | C | 0 | 0 | 0 |

A skilled person in the art may be able to obtain tables analogous to Table 1 for the other schemes of FIGS. 8-12. Hereinafter reference may be made only to the coding scheme of FIG. 7.

Even if the choice of pairs of levels in the diagram is arbitrary, in particular, for the pairs of a same transition stage (for example, assigning 'AB', 'EB' and 'BA' in the first stage), any approach always leads to associating the two pairs of levels 'AC' and 'CA' to a same triplet of bits, as highlighted in the table. The final stage of pairs of cells may depend on the state assumed prior to the programming operation: 'AC' in case of programming '010' starting from '110' ('AB'); 'CA' in case of programming '0101' starting from '011' ('BA'); and 'AC' or 'CA' in case of programming '010' starting from '111' ('AA').

Figure 13:
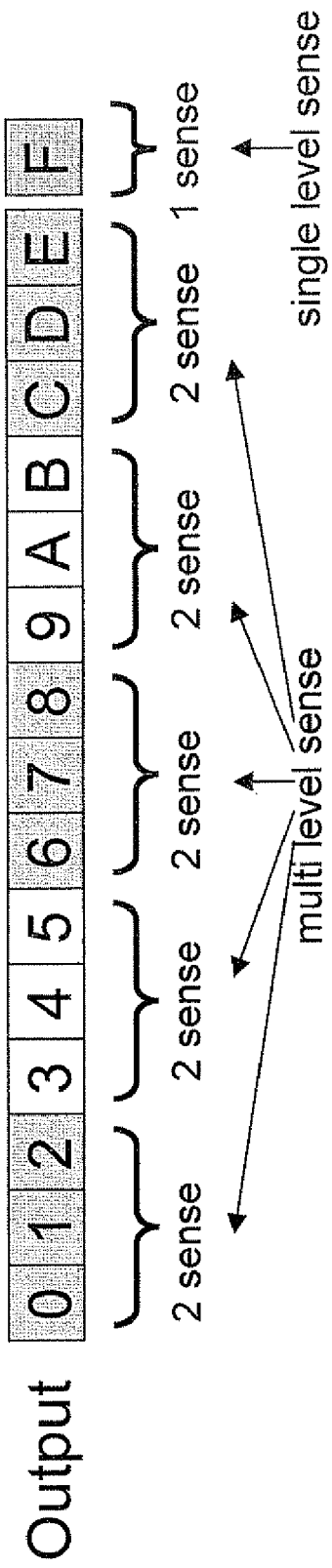
FIG. 13 depicts a sample coding of a word comprised of 16 bits in eleven three-level cells, according to the present invention.
Figure 14:
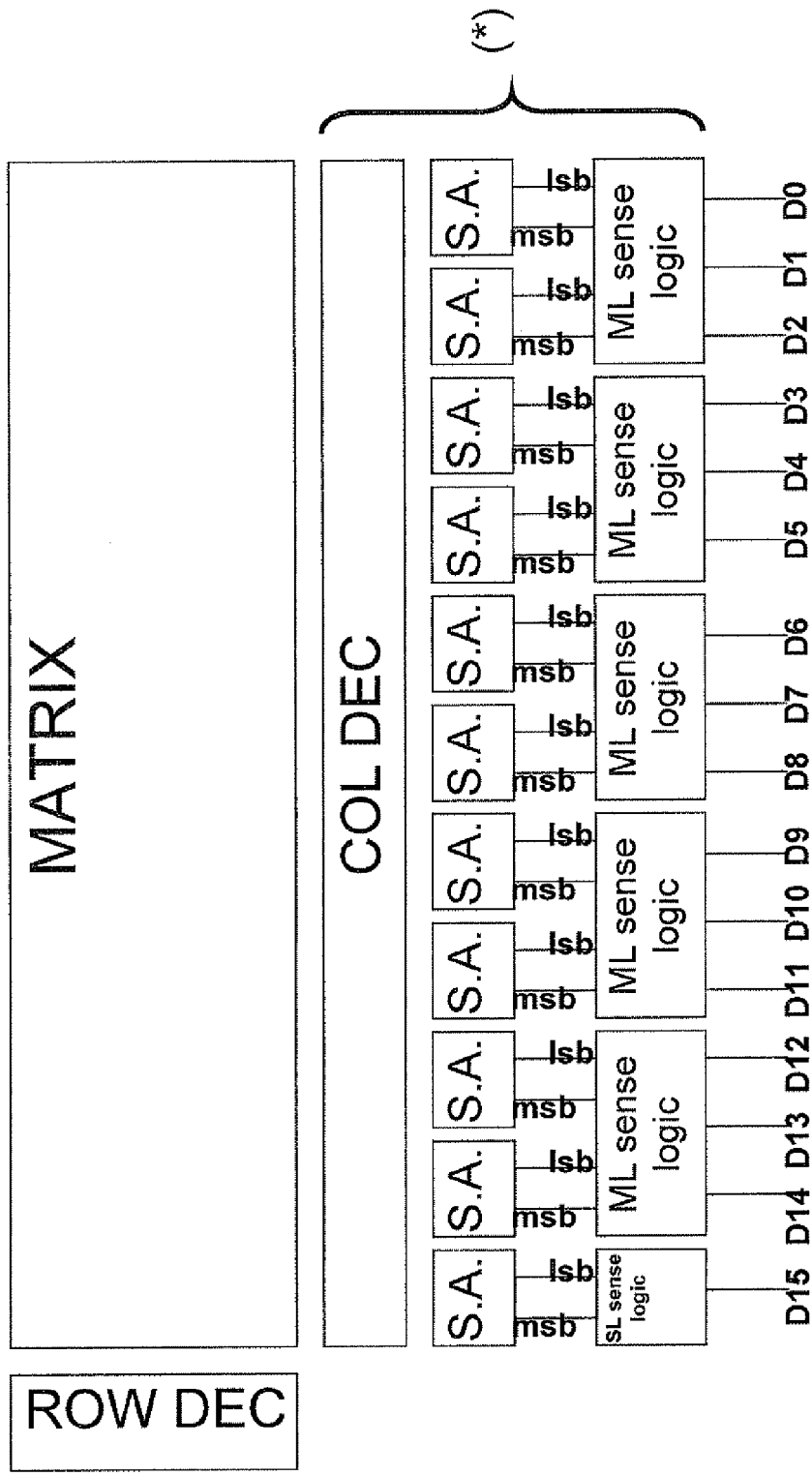
FIG. 14 depicts an architecture of a memory device of the present invention in which stored data are read in words of sixteen bits.

A sample architecture of a memory device is depicted in FIG. 14. The basic information element of a FLASH memory device may be the word, typically comprising 16 bits. To store 16 bits, according to the preferred grouping scheme of the method depicted in FIG. 13, five pairs of three-level cells are needed with a one bit remainder, that conveniently, but not necessarily, may be either the most significant or the least significant bit, that is stored in an eleventh cell destined to store a single bit. In practice, this last cell assumes only two of the three possible levels.

A skilled person in the art may recognize that it is not necessary that the single bit to be stored in the three-level cell destined to store a single bit be the most significant or the least significant bit, but it can be any other bit of the word. Referring to the scheme of FIG. 13, if for example the bit 9 is stored in a single three-level cell, then the bits 0 to 8 are grouped in triplets as illustrated, and the remaining two triplets of bits may be A, B, C and D, E, F stored in respective pairs of three-level cells. Other examples of grouping in triplets are illustrated in FIGS. 21-24 and may be discussed hereinafter.

It may be remarked that triplets of bits to be stored in pairs of three-level cells may not necessarily be comprised of adjacent bits of a word. The grouping of bits into triplets of a word, each triplet being stored in a respective pair of three-level cells, depends on how the memory may be programmed. As explained in detail hereinbelow, if the three-level memory device is to be used as a two-bit-per-cell memory device while addressing problems due to accidental voltage drops during program phases, then not all possible ways of grouping bits in triplets are available.

Figures 15, 16:
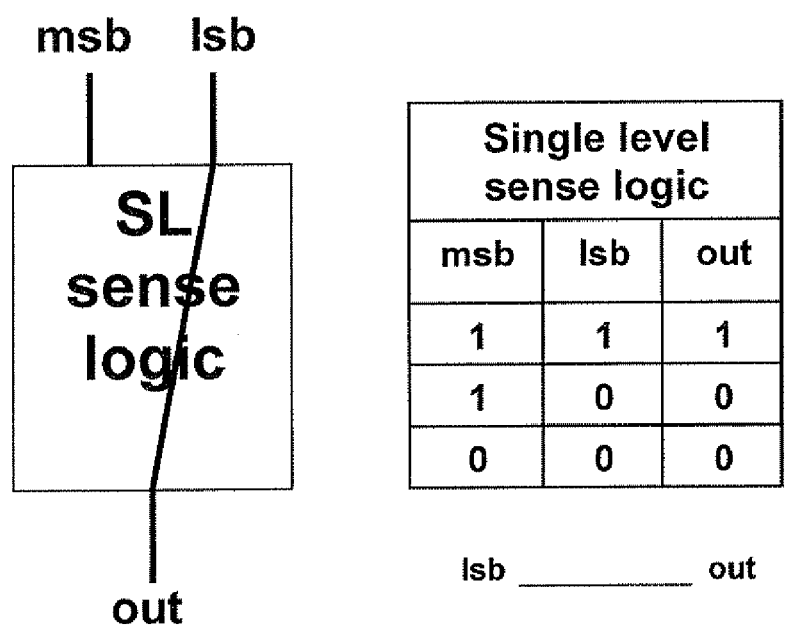
FIG. 15 illustrates an example of decoding of the program levels of a three-level-cell in a pair of bits MSB, LSB, according to the present invention.
FIG. 16 illustrates an example of a decoding of the program levels of a three-level-cell destined to store only one bit and the architecture of a related decoding circuit, according to the present invention.
Figure 17:
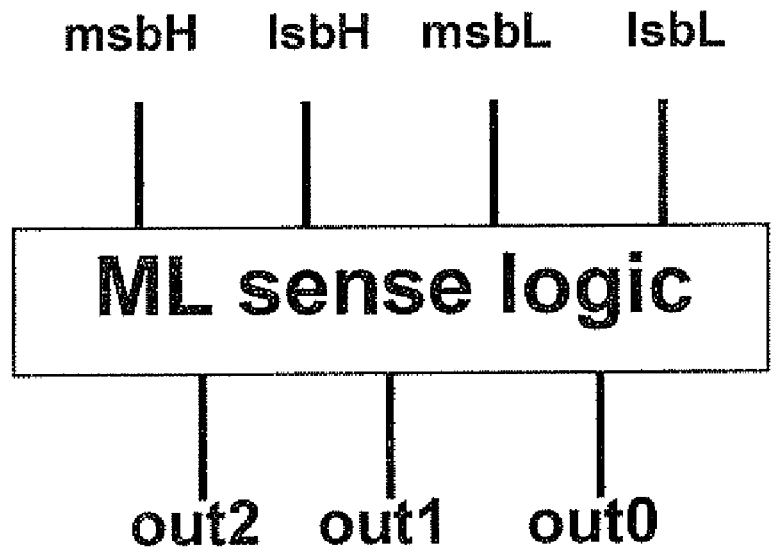
FIG. 17 illustrates how to decode a triplet of bits stored in a respective pair of three-level cells using the coding scheme of FIGS. 7 and 15.
Figure 18:
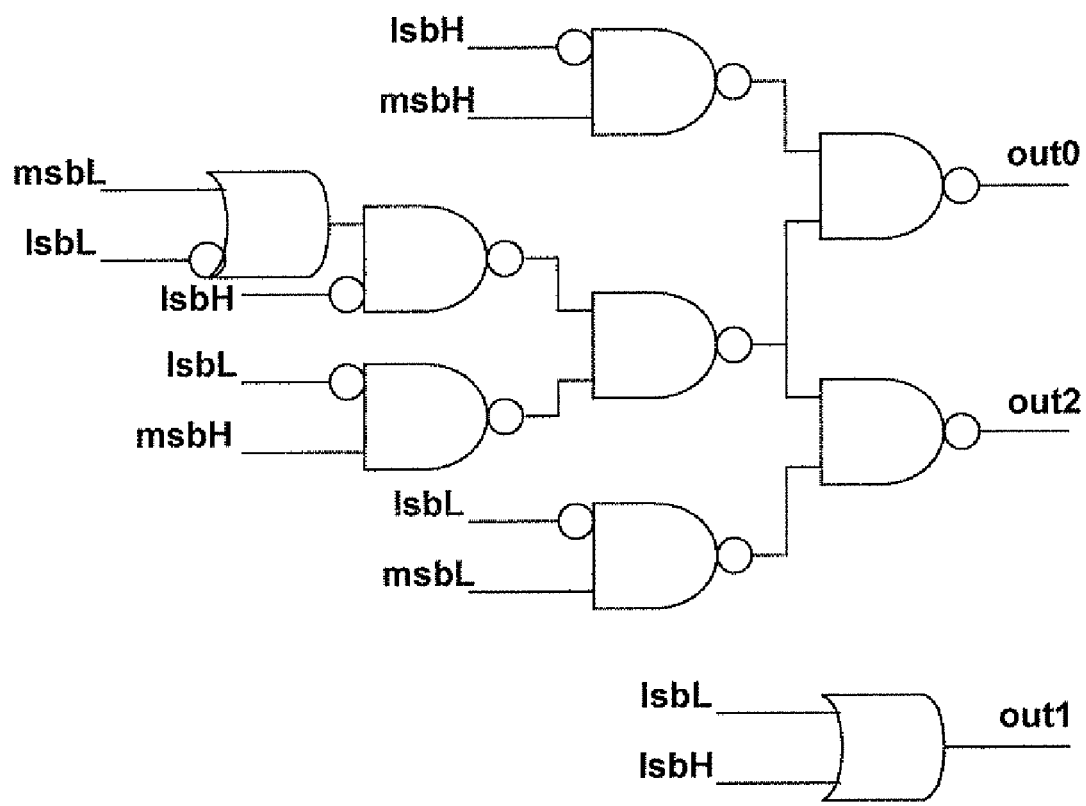
FIG. 18 illustrates a possible architecture of a read logic decoding circuit that implements the decoding scheme of FIG. 17.

The memory device depicted in FIG. 14 has an array of identical sense amplifiers S.A., each associated to a respective three-level cell of the word to be read and generating two bits MSB, LSB representative of the program level of the cell, preferably according to the coding scheme of FIG. 15. Differently from a typical device, according to the embodiment of FIG. 14, the memory device has, for each word that constitutes a page to be read, an array of five identical logic decoding circuits ML SENSE LOGIC, Each logic decoding circuit is associated to a respective pairs of three-level cells. Another logic decoding circuit SL SENSE LOGIC is associated to the three-level cell intended to store a single bit. Each circuit ML SENSE LOGIC receives at its input two pairs of bits generated by the sense amplifiers of a pair of three-level cells and generates a corresponding triplet of bits OUT2, OUT1, OUT0, as shown in FIG. 17. A possible embodiment of the logic circuit ML SENSE LOGIC is depicted in FIG. 18, as will be readily understood by the skilled person in the art.

The logic decoding circuit SL SENSE LOGIC, as depicted in FIG. 16, has a logic signal propagation path such that it outputs the least significant bit LSB of the input pair of bits MSB, LSB. This happens because it has been assumed that the two logic levels of the bits are encoded in the threshold voltage levels A and B of the three-level cell, the third level C remaining unused. If the two levels of the bit to be stored were coded in levels A and C of the three-level cell, the same logic decoding circuit SL SENSE LOGIC would output the most significant bit MSB instead.

The read operation is carried out by reading pairs of three-level cells and decoding the read ternary levels in strings of three bits, according to the coding scheme depicted in Table 1 and illustrated in FIG. 17. The programming step may be preceded by a coding step for transforming triplets of bits to be stored in the memory into pairs of ternary levels to be programmed in the cells. In this case it is may be helpful to take into account the initial state of the cells for performing the "bit manipulation" and eventually for choosing between AC and CA in case of writing the triplet of bits '010'.

The area ratio between the array of cells of a one-bit-per-cell, a three-level cell and two-bit-per-cell memory device is: 16 cells per word for a one-bit-per-cell memory device; 11 cells per word for a three-level-cell memory device; and 8 cells per word for a two-bit-per-cell memory device. The larger number of cells per word of this memory compared with the number of cells per word of a four level memory device is significantly compensated by the possibility of carrying out "bit manipulation" without the restrictions due to ECCs and without the problems due to "read disturb" and "retention" phenomena.

As common to multi-level memory devices, also the memory device may suffer the effect of any voltage drop or interruption that accidentally could take place during programming operations. To better understand this problem, let us refer to the scheme of FIG. 19 for a cell that stores two bits.

Let us suppose that an initially erased cell (11) is to be programmed in the state 01: this operation is compliant with the "bit manipulation" because only one bit is programmed. The threshold voltage Vth of the cell may thus be incremented by providing program pulses to the cell, as far as it is comprised in the distribution curve relative to the level 01.

Figure 19:
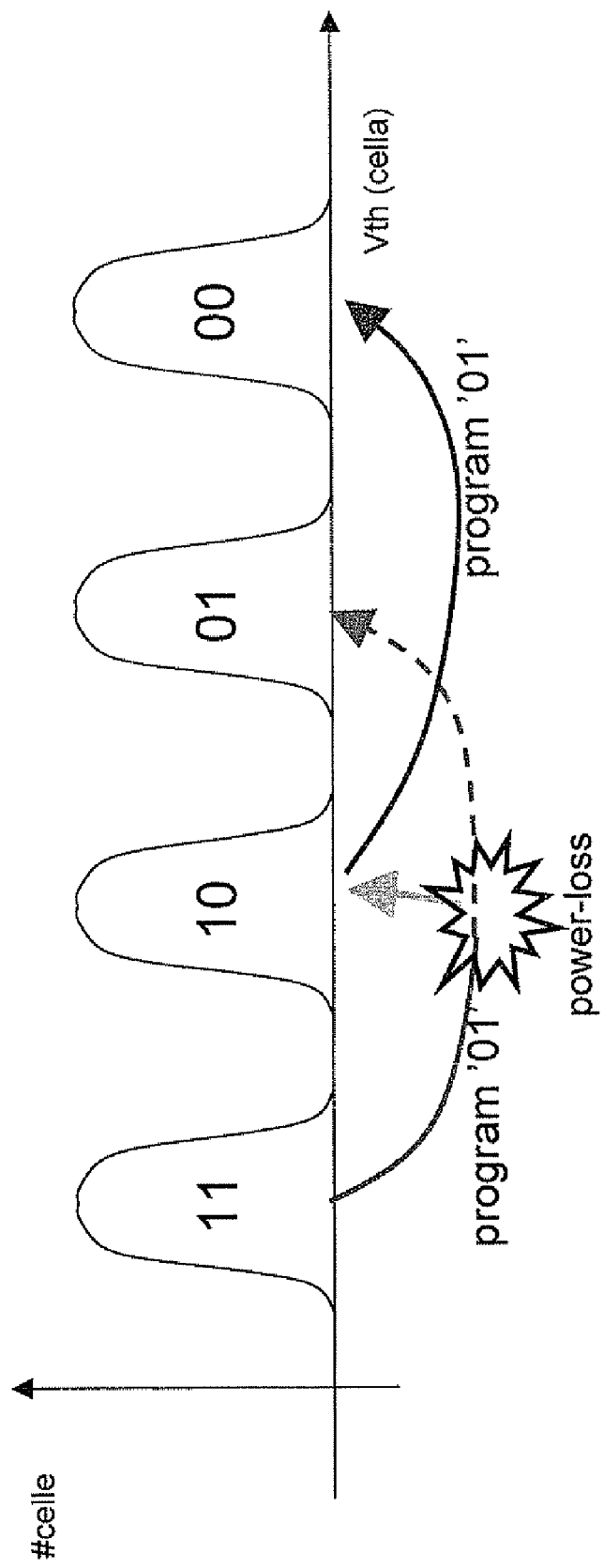
FIG. 19 illustrates schematically the effects of a supply voltage interruption during a program operation of a four-level cell, according to the present invention.

As schematically illustrated in FIG. 19, it may happen that a supply voltage drop sufficient to stop the program operation may take place when the threshold voltage Vth is within the distribution corresponding to the level 10. In this case, the transition 11→10 has taken place and it is not possible to program further the cell to the state 01 because the transition 10→01, even if physically possible, violates "bit manipulation" and it is forbidden by the control circuits of the memory. Repeating the same program operation does not overcome the problem, because a cell in the state 10 would go to the state 00.

A possible approach comprises carrying out an erase operation for bringing the cell from the state 10 back in the state 11 then repeating the program operation. This is not convenient, particularly in NOR FLASH memory devices, because the erase operation may be carried out only on a whole sector and not on a single cell. In practice, to comply with "bit manipulation" rule, a bit at the logic level 1 may be programmed at the logic level 0 but the opposite is not allowed to be made through a program operation.

For this reason, to guarantee a reliable storing of information even in case of accidental voltage drops or interruptions during program operations, data should be written in the memory by programming always adjacent pairs of bits. This is equivalent to programming a four-level cell to the 00 state. This is always possible without violating the rules of "bit manipulation", because a four-level cell may always be programmed to the state 00 whether if it is in the state 10 or the state 01.

A further advantage of the three-level memory device comprises that it may be used as if it was a two-bit-per-cell memory device. Users may use a three-level memory device with the same program operations that they would carry out with a two-bit-per-cell memory device while respecting the rules of "bit manipulation", provided that the bits be grouped in triplets to be stored in pairs of three-level cells as shown hereinbelow. Therefore, the three-level memory device is compatible or interchangeable with a two-bit-per-cell memory device of identical storage capacity.

For preserving such compatibility, a program method that allows programming correctly pairs of adjacent bits (00) of a word, complying with the "bit manipulation" rules, even in presence of accidental supply voltage drops is as follows. In a two-bit-per-cell memory device, each cell normally stores a pair of adjacent bits. The bit pairs 01, 23, 45, 67, 89, AB, CD, EF of the depicted word are stored in respective eight four levels cells. In a two-bit-per-cell memory device the pairs 12, or 34 and so forth are not programmed (00) because these pairs of bits are not stored in the same cell.

To be able to program a three-level memory device as a four-level memory device in case data may be written with high reliability notwithstanding the fact that the supply voltage may be subject to accidental drops or interruptions during program phases, it may be possible to program (00) only the above indicated pairs of bits. From FIG. 5, which illustrates the possible states of a three-level cell, it may be inferred that an eventual supply voltage drop or interruption would be dangerous only if it takes place during a program operation from A to C while the threshold voltage of the cell corresponds to the level B.

Figure 20:
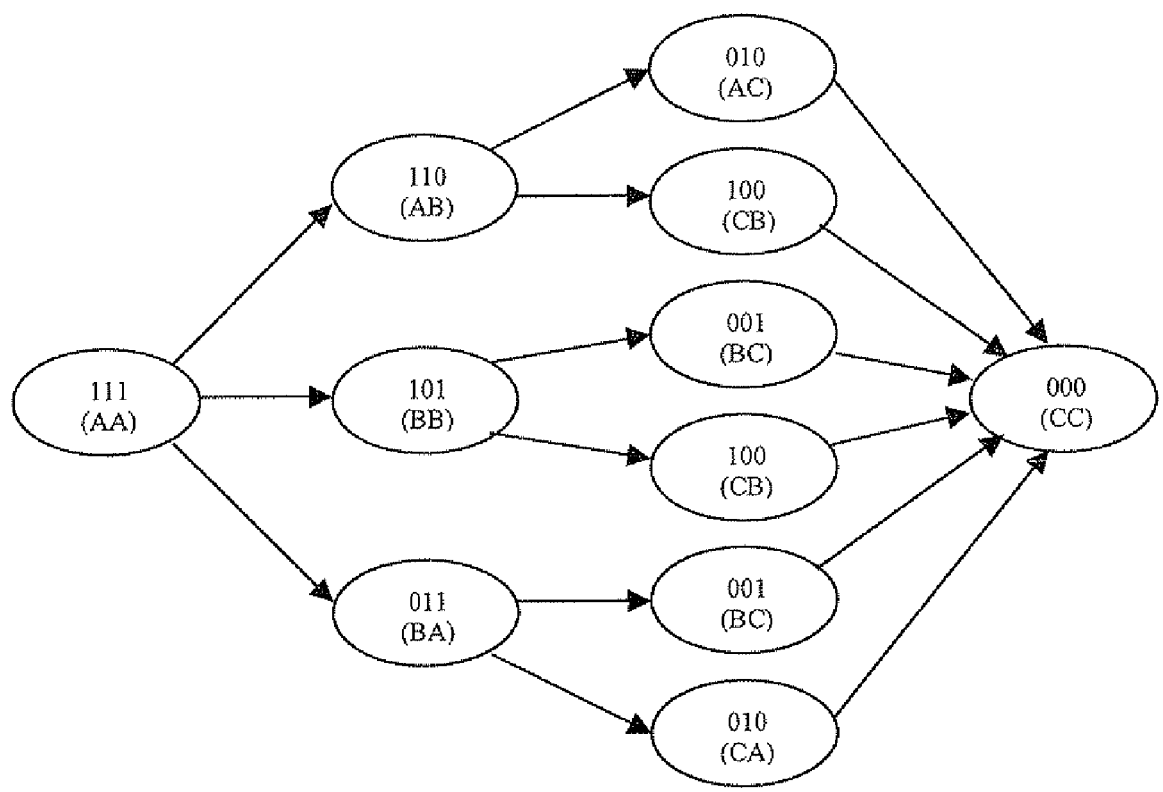
FIG. 20 depicts the coding scheme for the three-level memory device of this invention for preventing problems due to eventual supply voltage interruptions (or arresting voltage drops) during program phases, according to the present invention.

Referring to the coding scheme of FIG. 20 and to the grouping scheme of FIG. 13 of the three-level memory device, it is noticed that if two adjacent bits of a bit string are to be programmed (00) as in two-bit-per-cell memory device, no pair of three-level cells may ever be programmable in any of the states BB, AC and CA, while all other states may be programmable.

Therefore, starting from a pair of erased three-level cells, that is in the state AA (111), only the following cases are permitted: if two adjacent bits to be programmed (00) belong to the same triplet of bits, then the pair of three-level cells should be programmed in one of the states CB (100) and BC (001); and if two adjacent bits to be programmed (00) belong one to a triplet of bits and the other to another triplet of bits adjacent to the first triplet, then the pair of three-level cells should be programmed in one of the states AB (110) and BA (011).

Starting from a pair of three-level cells in the state AB (110) or BA (011), only the following case is permitted: if the two adjacent bits to be programmed (00) belong to the same triplet of bits, then the pair of three-level cells should be programmed in the state CC (000). Starting from the states BC and CB, the pair of three-level cells may be programmed only in the state CC. Therefore, it may be practically impossible to program a pair of three-level cells in the forbidden states BB, AC, and CA.

Problems due to accidental voltage drops or interruptions during program operations are possible only if between the initial and final states of the pairs to be programmed there is at least an intermediate state at which the program operation could accidentally stop. Recalling that a program operation of two adjacent bits (00) is prevented from reaching the forbidden states BB, AC and CA for the above explained reasons, the only program operations that contemplate transitions through an intermediate state are: 1) the program operations from a state AA, AB or BA to the state CC; and 2) the program operations from the state AA either to the state CB or BC.

Even if a supply voltage drop or interruption occurs, the step mentioned at point 1) could always be completed correctly simply by repeating the untimely interrupted program steps until the state CC is reached. The steps mentioned at point 2) could not be completed correctly if an arresting voltage drop takes place while the pair of three-level cells is being programmed, unless the following precautions are adopted.

Let us consider for example the program operation AA→CB. Both cells are supplied in parallel with a succession of program pulses for reaching the state BB. Once the state BE has been reached, the least significant cell of the pair is deselected and program pulses are supplied to the most significant cell of the pair, such to reach the state CB. Though, it may happen that the most significant cell reaches the state B before the least significant cell. In this situation, should a supply voltage drop occur, the program operation may stop with the pair of three-level cells is in the state BA where from it would not possible to go to the state CB without violating the rules of "bit manipulation". The above described problem would be encountered in the same way also when programming from the state AA to the state BC.

According to an embodiment of the method, the program operations mentioned at point 2) are carried out in two steps: first the cell of the pair that may reach the level B is programmed, then the other cell is programmed from the level A to the level C. In practice, the transition AA→CB (or similarly AA→BC) is carried out through the following program steps: a) AA→AB (AA→BA); and b) AB→BB→CB (BB→BC).

With the above transition scheme, the above discussed problems due to an untimely accidental supply voltage drop or interruption are dealt with because the programming step a) takes place by changing a single level of the state of a cell and the programming step b) may be completed correctly even if a supply voltage interruption took place while the pairs of cells were in the intermediate state BB. Indeed, starting from the state BB, it is possible to reach the state CB (or BC) by a single level shift of the state of the cell.

Figure 9:
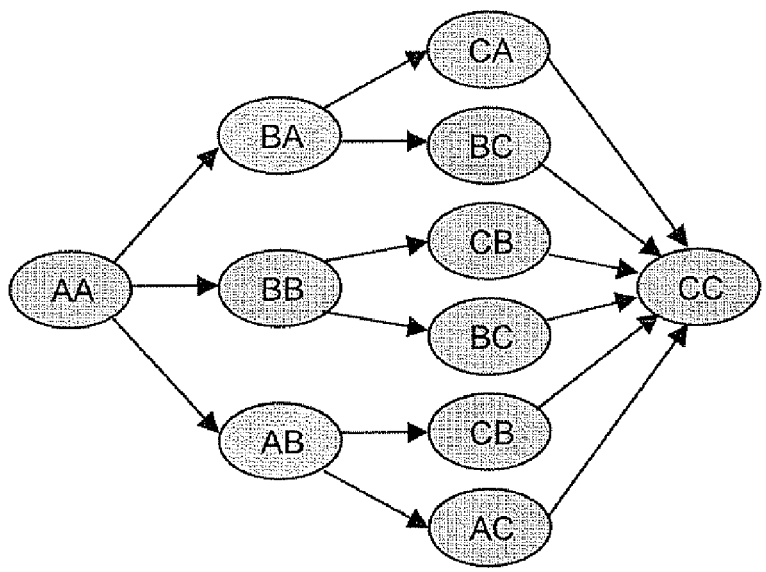
FIG. 9 depicts yet another embodiment of possible transitions of a string of two ternary symbols according to a second alternative coding scheme of the present invention.

It is to be noticed that the above described problem avoiding technique works if the preferred coding scheme of FIG. 20 or of FIG. 9 is used, having grouped the bits in triplets according to the scheme of FIG. 13. If the state BB was associated to the triplet 110 (FIG. 12) or 011 (FIG. 11), the programming AA→BB would be allowed and would let the pair of cells to be programmed pass through the intermediate states BA or AB. Should a supply voltage interruption or blocking drop occur when the pair of cells is in the BA or AB state, then the BB state would not be reachable without violating the rules of "bit manipulation".

Figure 8:
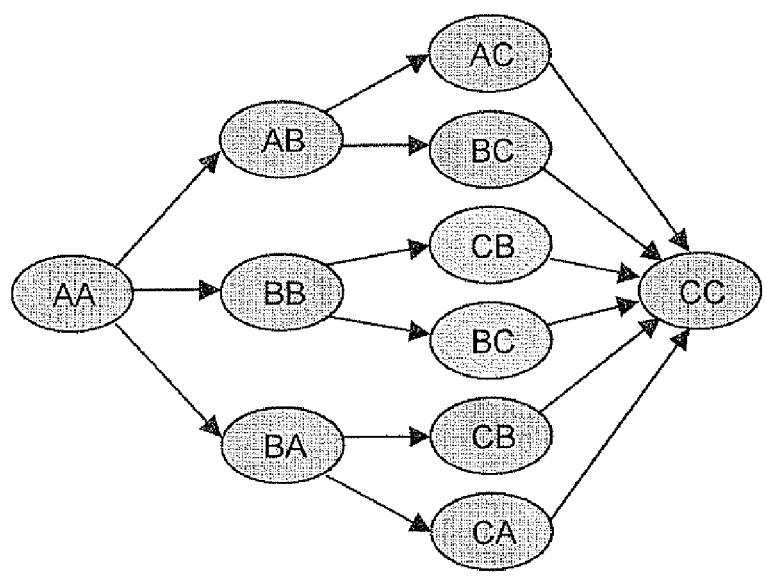
FIG. 8 depicts another embodiment of possible transitions of a string of two ternary symbols, according to the present invention.
Figure 10:
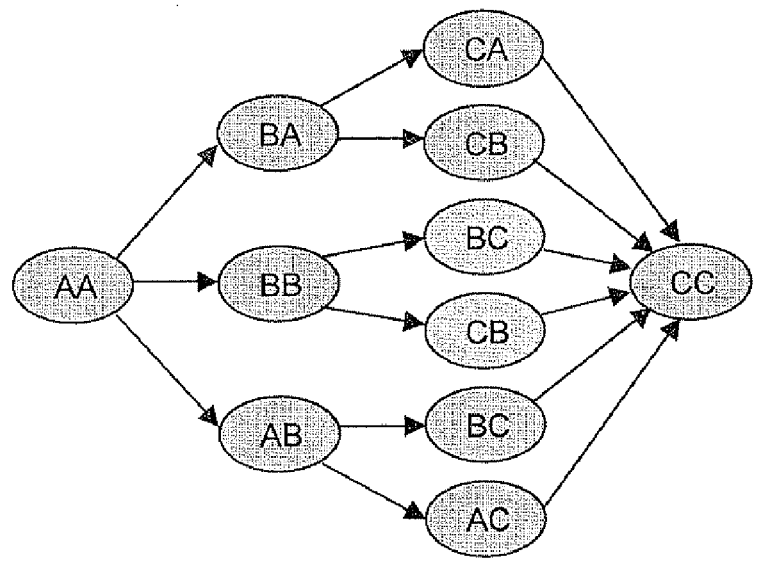
FIG. 10 depicts another embodiment of possible transitions of a string of two ternary symbols according to a third alternative coding scheme of the present invention.
Figure 11:
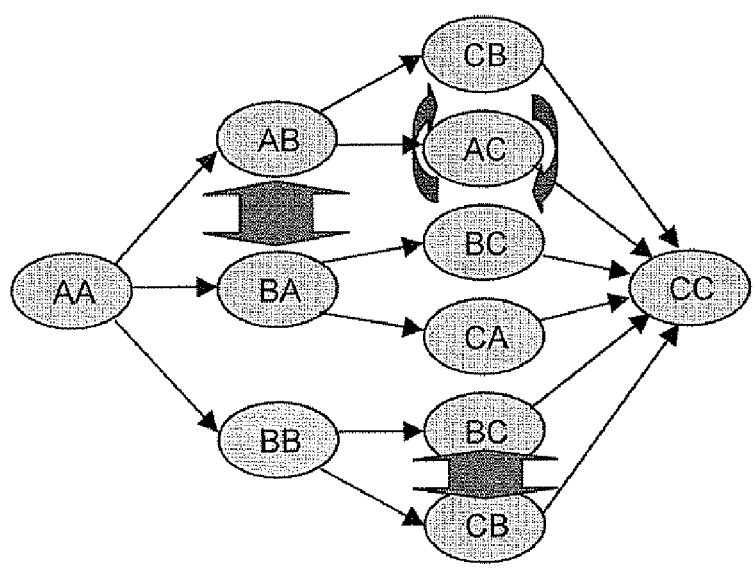
FIG. 11 depicts other embodiments for possible transitions of a string of two ternary symbols according to a fourth, fifth, sixth and seventh alternative coding schemes according to the present invention.
Figure 12:
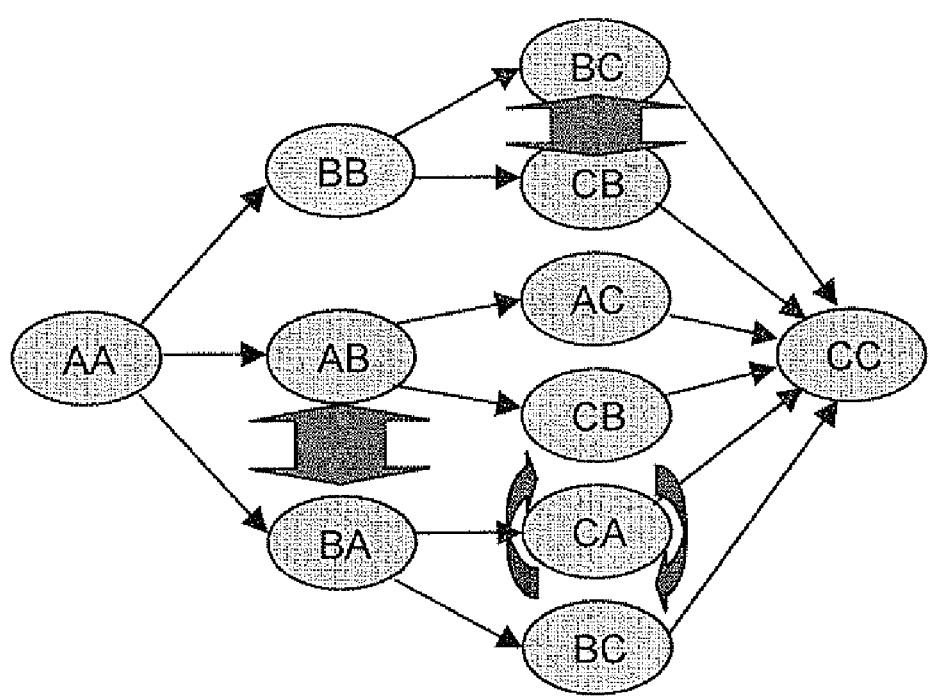
FIG. 12 depicts more embodiments of possible transitions of a string of two ternary symbols according to a eight, ninth, tenth and eleventh alternative coding schemes according to the present invention.

With the schemes of FIGS. 8 and 10, the programming step b) would not be possible because from the state AB (BA), it is not possible to reach the state CB (BC). Practically, according to the above described technique, two distinct program operations for passing from the state AA to the state CB or BC are carried out instead of a single operation, but this ensures that every programming operation can be correctly completed even in the event of a supply voltage drop or interruption. As already discussed, it is not necessary that pairs of three-level cells codify triplets of adjacent bits, but it is sufficient that triplets of bits be chosen such to avoid programming pairs of three-level cells in the non admissible states BB, CA and AC.

FIGS. 21 to 24 depict words of 16 bits and different schemes of grouping them in triplets. Adjacent boxes of the same tint represent the bits of a same triplet and the isolated box is the single bit of the word that is stored in a three-level cell. These figures show the pairs of adjacent bits that may be programmed by the user, that are 01, 23, 45, 67, 89, AB, CD and EF, when the three-level memory device is used as a two-bit-per-cell memory device.

Figure 21:
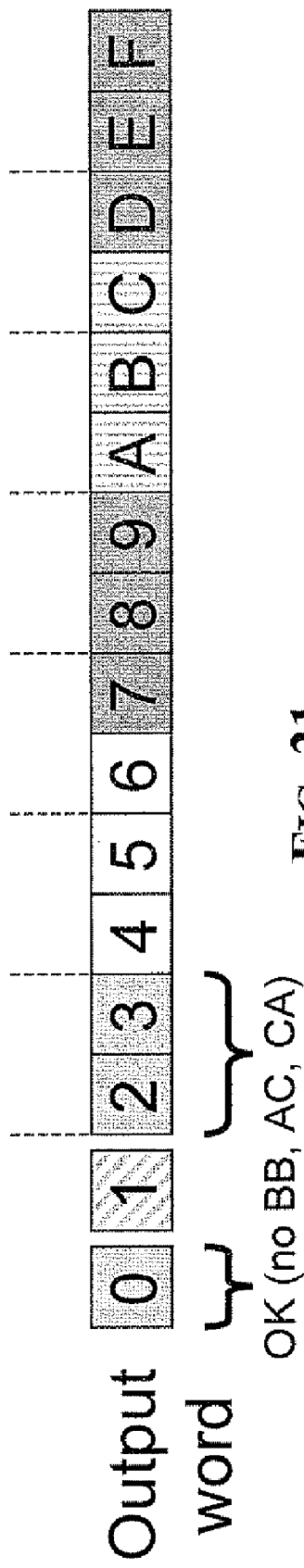
FIGS. 21-24 illustrate examples of coding of a word comprised of 16 bits in eleven three-level cells by grouping in triplets bits of the word, according to the present invention.
Figure 22:
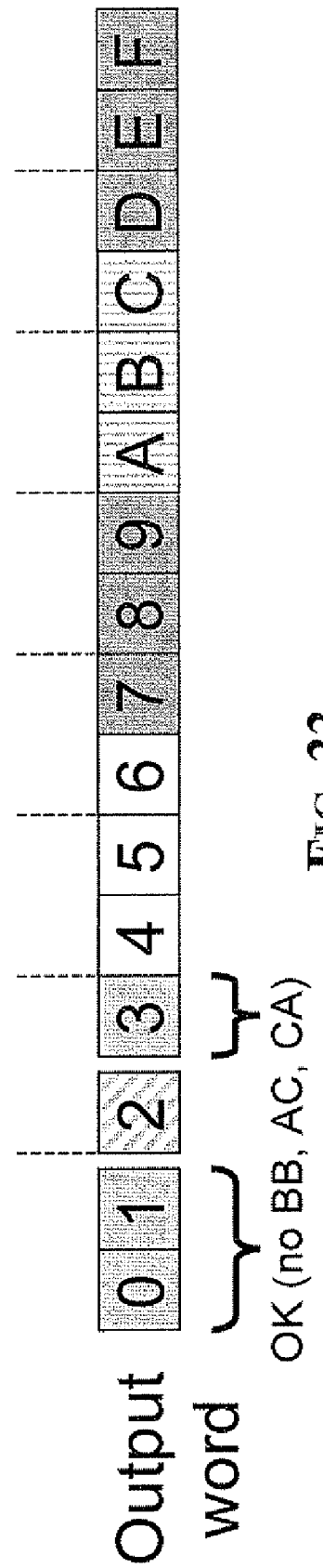

FIG. 21 shows the case in which the bit to be stored in a three-level cell is the bit 1, thus the triplet 023 is to be stored in a respective pair of three-level cells. This grouping scheme is chosen because it is not possible to program in the non admissible states BB, AC and CA the pair of three-level cell that stores the triplet 023. The same observations hold in the same manner for the grouping schemes of FIGS. 22 and 24, in which the bit to be stored in a three-level cell is the third least significant bit 2.

Figure 23:
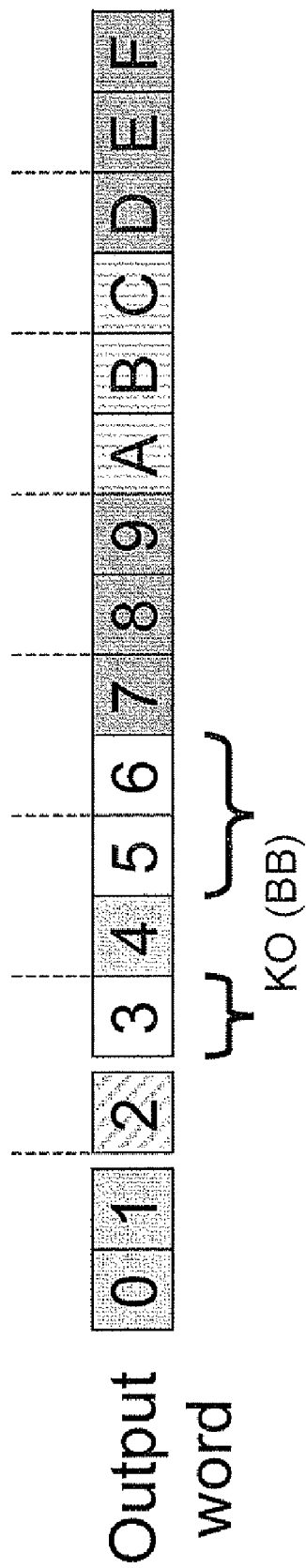
Figure 24:
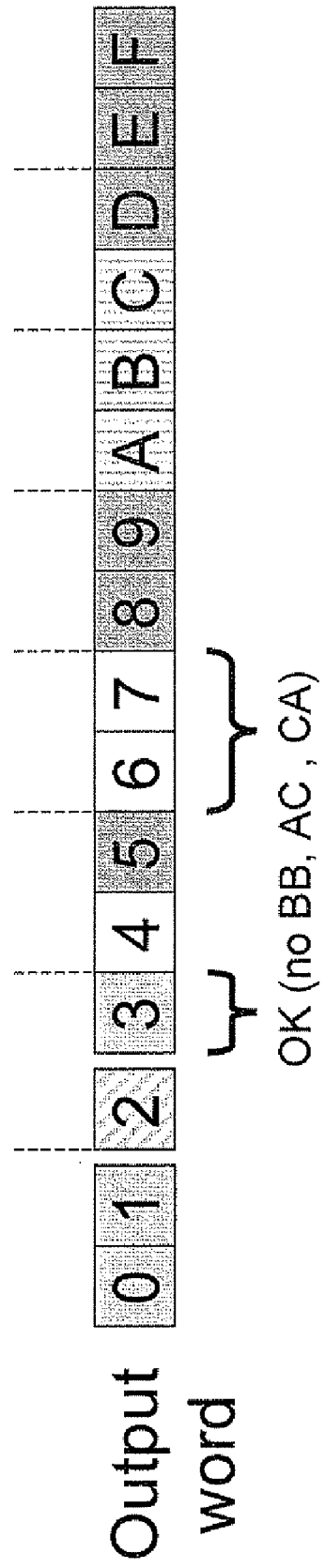

FIG. 23 shows another grouping scheme in which the bit to be stored in a three-level cell is the third least significant bit (2). Differently from the examples illustrated in FIGS. 22 and 24, with this grouping scheme it may happen that a pair of cells be programmed to the state BB. Starting from a situation in which the bits from 3 to 6 are erased, if a user programmed (00) the bits 4 and 5, the triplet of bits 356 would be in the state 101, thus the respective pair of three-level cells should be programmed to the state BB. From the above examples it is evident that the bit to be stored in a single three-level cell could be any bit of the word, thus avoiding problems due to accidental supply voltage drops or interruptions, provided that the other bits be grouped in triplets such that no pair of cells be programmed in one of the states BB, AC, or CA.

As may be evident to any skilled person, the disclosed method can be easily generalized for a memory having cells that may assume one out of k different levels by grouping the cells in sets of c cells and by storing in each c-tuplet of cells a number N of bits given by the following formula:

$$N = int[c \cdot \log_2 k]$$

wherein the function int[ ] truncates its argument. The number c of cells should be chose such to reduce the number of unused states given by $k^c - 2^N$.

Figure 25:
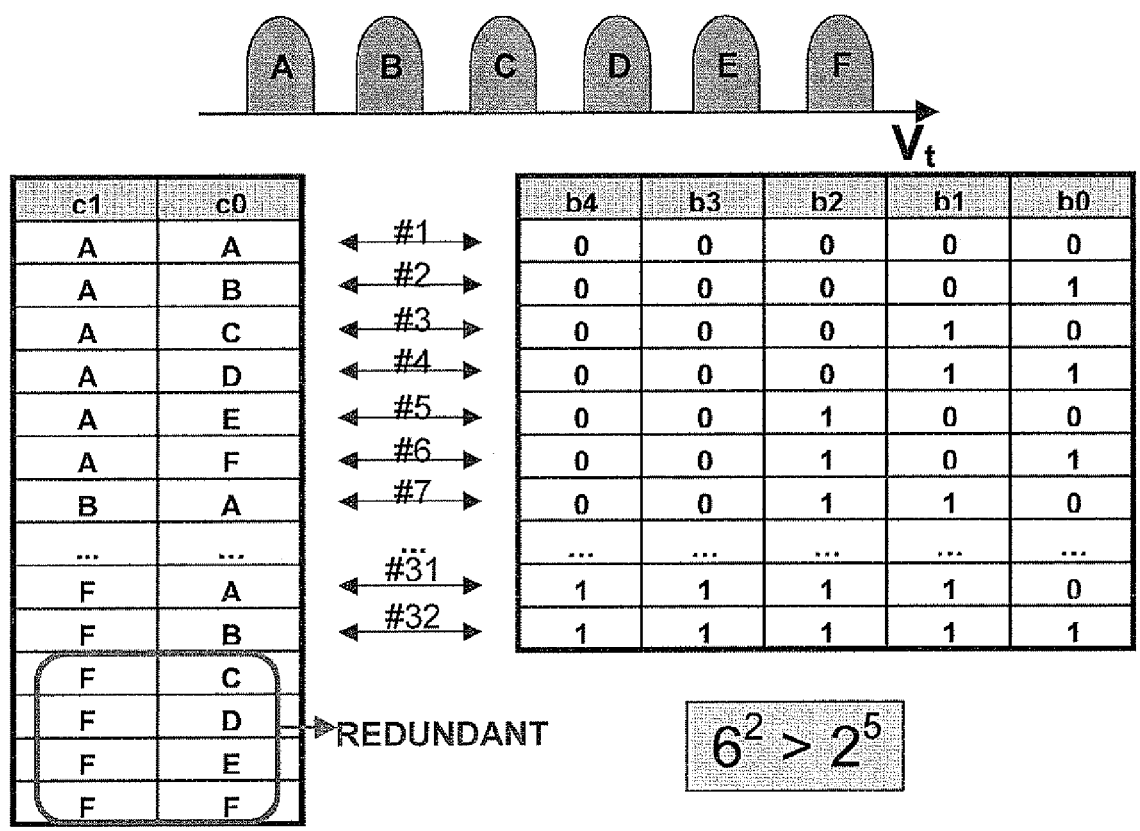
FIG. 25 illustrates how the bits of a same word are grouped in quintuplets to be stored into respective pairs of six-level cells, according to the present invention.

In this general case, the coding and decoding circuits of the memory may convert strings of N bits into strings with k levels and vice versa using an appropriate code. The disclosed technique allows simulating the functioning of a memory with cells with $2^z$ levels using a memory with cells with a number of levels k smaller than $2^z$. This may not be immediately useful while, for technological reasons, it is impossible to realize cells with $2^z$ levels, but it is possible to realize memory devices with k-level cells, being $2^{z-1} < k < 2^z$. According to another embodiment of the method, applicable to memory with six-level cells, the bits of each word are grouped in quintuplets and each quintuplet is stored in a respective pair of six-level cells, as schematically illustrated in FIG. 25.

That which is claimed is:

1. A memory device comprising:
an array of addressable three-level memory cells;
a coding circuit to be input with three-bit strings and to generate corresponding ternary strings based upon a code;
a program circuit to be input with the ternary strings and to store them in respective pairs of three-level memory cells;
a read circuit to read stored ternary strings in the respective pairs of three-level memory cells; and
a decoding circuit to be input with the stored ternary strings and to generate corresponding strings of three bits based upon the code.

2. The memory device of claim 1 wherein said array is organized in words for storing a string of sixteen bits; and wherein each word comprises a first three-level cell to store a bit of the string of sixteen bits, and five pairs of three-level memory cells to store the remaining fifteen bits.

3. The memory device of claim 2 wherein the bit stored in the first three-level cell is a most significant bit.

4. The memory device of claim 2 wherein the bit stored in the first three-level cell is a least significant bit.

5. The memory device of claim 2 further comprising an array of eleven sense amplifiers for each three-level cell of the word to be read and to generate a respective pair of bits representing a program level of a read cell; and wherein for each word to be read, said decoding circuit comprises:
an array of five decoding logic circuits, each input with two pairs of representative bits to be generated by a respective sense amplifier of one of the pairs of three-level memory cells, and to generate a corresponding triplet of bits; and
a logic decoding circuit to be input with the representative pair of bits generated by a sense amplifier associated to the first three-level cell, the first three-level cell storing a single bit and to output a read bit.

6. The memory device of claim 1 wherein said array is organized based upon a FLASH NOR architecture.

7. A method of managing a memory including addressable three-level memory cells, the method comprising:
storing strings of three bits by at least
coding the strings in corresponding ternary strings based upon a code, and
storing each of the ternary strings in a respective pair of three-level memory cells by supplying program pulses to the pair of three-level memory cells; and
reading the stored strings from the memory by at least
reading respective stored ternary strings from respective pairs of three-level memory cells, and
decoding each ternary string into a corresponding string of three bits based upon the code.

8. The method of claim 7 wherein the three-level memory cells of the memory are organized in words, each word comprising eleven three-level memory cells, and for storing a string of sixteen bits; and further comprising:
storing a bit of the string of sixteen bits in a first three-level cell, the remaining bits organized in triplets; and
storing the remaining five triplets of bits of the string of sixteen bits in respective five pairs of three-level memory cells of the word.

9. The method of claim 8 wherein the first three-level cell storing the bit is erased for storing a high logic level; and wherein the first three-level cell is programmed in one of the other two levels for storing a low logic level.

10. The method of claim 9 wherein the bit stored in the first three-level cell is the most significant bit.

11. The method of claim 9 wherein the bit stored in the first three-level cell is the least significant bit.

12. The method of claim 7 wherein the strings of three bits are coded in pairs of three-level memory cells based upon the following code:

| | |
|---|---|
| 111 | AA |
| 110 | AB |
| 101 | BB |
| 011 | BA |
| 010 | AC or CA |
| 100 | CB |
| 001 | BC |
| 000 | CC. |

13. The method of claim 12 wherein the pairs of three-level memory cells store strings of three adjacent bits of a same word.

14. The method of claim 12 further comprising programming a pair of adjacent bits belonging to at least one of a same initial string and two initial adjacent strings by identifying pairs of three-level memory cells to be programmed for encoding the strings of three bits and programming each pair of memory cells by at least:
   determining if a least significant or a most significant cell of the pair of three-level memory cells is programmed in a state corresponding to an intermediate program level and programming the state corresponding to the intermediate program level; and
   determining if the least significant or the most significant cell of the pair of three-level memory cells is programmed in a state corresponding to a high program level and programming the state corresponding to the high program level.

15. The method of claim 7 wherein the strings of three bits are coded in pairs of three-level memory cells based upon the following code:

| | |
|---|---|
| 111 | AA |
| 110 | BA |
| 101 | BB |
| 011 | AB |
| 010 | AC or CA |
| 100 | BC |

-continued

| | |
|---|---|
| 001 | CB |
| 000 | CC. |

16. The method of claim 15 wherein the pairs of three-level memory cells store strings of three adjacent bits of a same word.

17. A memory device comprising:
   an array of addressable memory cells with k levels, k being different from a power of two;
   a coding circuit to be input with strings of N bits for storing and to generate corresponding k-level strings based upon a code;
   a program circuit to be input with the k-level strings and to store the k-level strings in respective groups of c memory cells with k levels;
   a read circuit to read data stored in groups of c memory cells with k levels and to generate corresponding stored k-level strings; and
   a decoding circuit to be input with the stored k-level strings and to generate corresponding strings of N bits read from the memory based upon the code.

18. The memory device of claim 17 wherein said array is organized in pages of a set number of words, each word for storing a string of sixteen bits; wherein k comprises six; wherein N comprises five; wherein c comprises two; and wherein k-level strings comprises senary strings, said coding circuit to store the senary strings in respective pairs of six-level memory cells.

19. A method of managing a memory device that includes an array of addressable memory cells with k levels, k being different from a power of two, the method comprising:
   storing strings of N bits by at least
      coding the strings of N bits in corresponding k-level strings based upon a code, and
      storing each of the k-level strings in respective groups of c memory cells with k levels by providing program pulses to the groups of c memory cells with k levels; and
   reading strings of N bits from the memory by at least
      reading respective k-level strings stored in respective groups of c memory cells with k levels, and
      decoding each read k-level string into a corresponding string of N bits based upon the code.

20. The method of claim 19 wherein k comprises six; wherein N comprises five; wherein c comprises two; and wherein k-level strings comprises senary strings, said coding circuit storing the senary strings in respective pairs of six-level memory cells.

* * * * *